United States Patent [19]

Johnston

[11] Patent Number: 5,187,546
[45] Date of Patent: Feb. 16, 1993

[54] DISPLACEMENT MEASUREMENT APPARATUS WITH DUAL WEDGE INTERFEROMETERS

[75] Inventor: James S. Johnston, West Sussex, United Kingdom

[73] Assignee: Rosemount Limited, West Sussex, United Kingdom

[21] Appl. No.: 781,035

[22] Filed: Oct. 18, 1991

[30] Foreign Application Priority Data

Oct. 23, 1990 [GB] United Kingdom ............... 9022969

[51] Int. Cl.[5] .............................................. G01B 11/02
[52] U.S. Cl. .................................... 356/358; 356/356; 356/399; 356/419; 250/566
[58] Field of Search ............... 356/358, 356, 355, 419, 356/399, 401; 250/561, 566, 568; 235/454, 484, 485; 360/161

[56] References Cited

U.S. PATENT DOCUMENTS 4,428,239 1/1984 Johnston ................................. 73/705
4,636,076 1/1987 Pettigrew ............................. 356/356
5,037,206 8/1991 Etzkorn et al. ...................... 356/356

FOREIGN PATENT DOCUMENTS 0013971 8/1980 European Pat. Off. .
2033578A 10/1979 United Kingdom .
2114834A 8/1983 United Kingdom .
2120880A 12/1983 United Kingdom .
2126444B 3/1986 United Kingdom .
2209101A 8/1987 United Kingdom .
2225422A 8/1989 United Kingdom .

OTHER PUBLICATIONS

Thomas Bosselmann et al., Multi-Mode Fiber Coupled Interferometric Position Sensor, Opto 85 21/23 May 1985, pp. 168 and 169.
D. Trouchet et al., Prototype Industrial Multi-parameter F.O. Sensor Using White Light Interferometry, Springer Proceedings in Physics, vol. 44 (1989), pp. 227-233.

Primary Examiner—Samuel A. Turner
Assistant Examiner—LaCharles P. Keesee
Attorney, Agent, or Firm—Kinney & Lange

[57] ABSTRACT

Displacement measurement apparatus (1) shown in FIG. 1 measures the position of a reading means (4) relative to a coded track (2) which carries a sequence of code elements (5). The track is encoded with a binary sequence such that reading a binary word at any position along the track uniquely identifies its position. The binary word is remotely sensed by a decoding means (18) via a fibre optic link (12). Position information is encoded optically by the reading means using an interferometer to frequency modulate the transmitted light and the decoding means has a second interferometer to analyse received light and produce an electrical output representing the binary word.

13 Claims, 5 Drawing Sheets

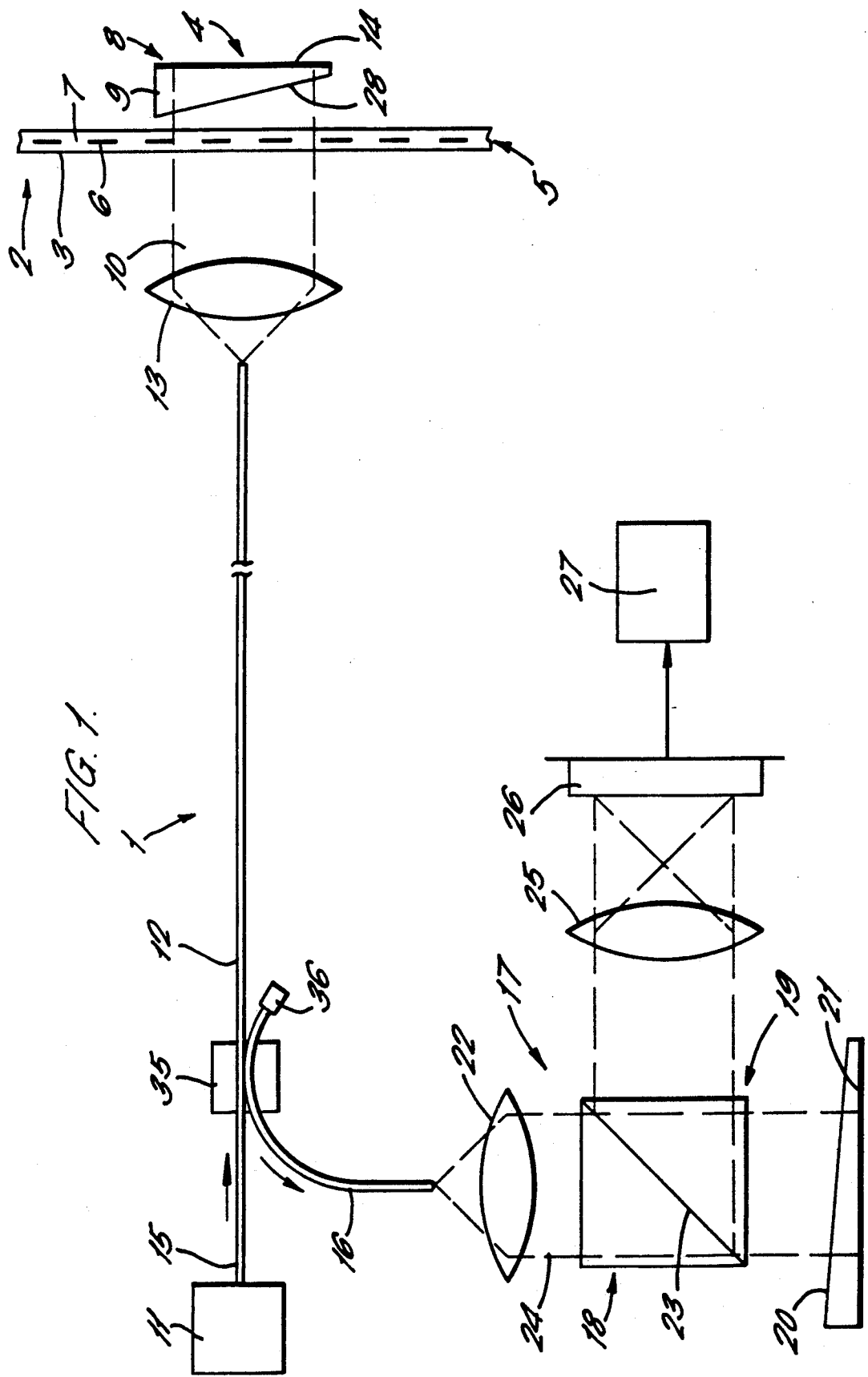

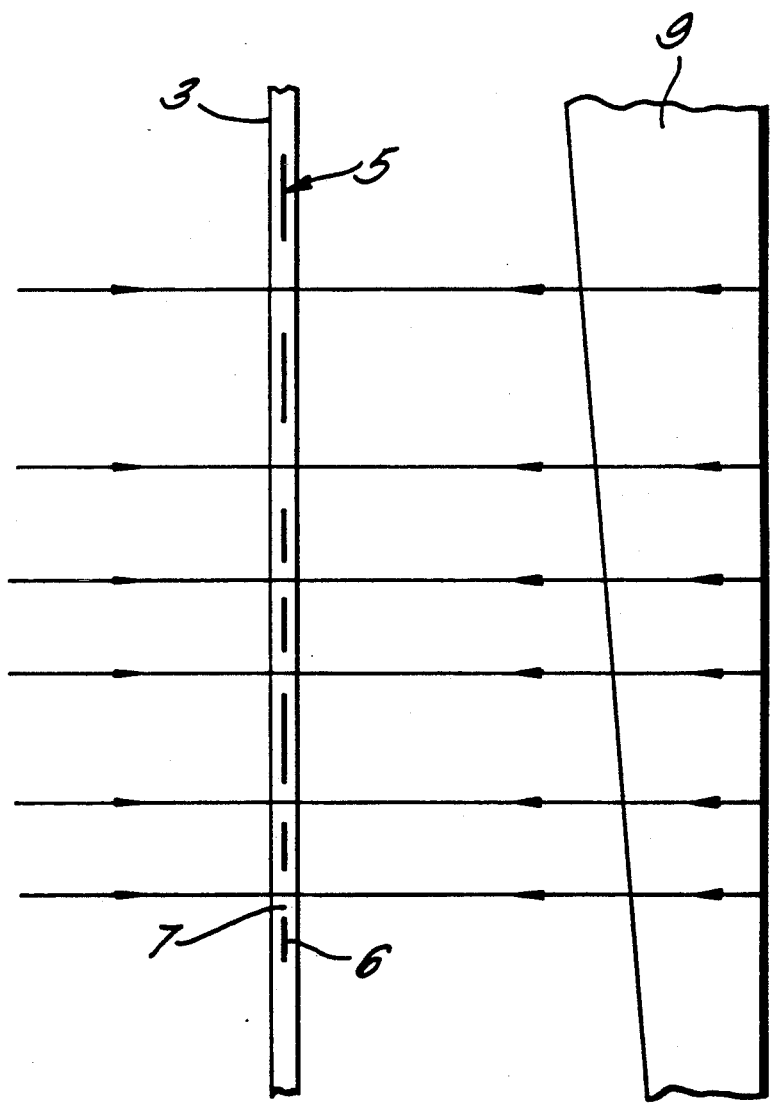

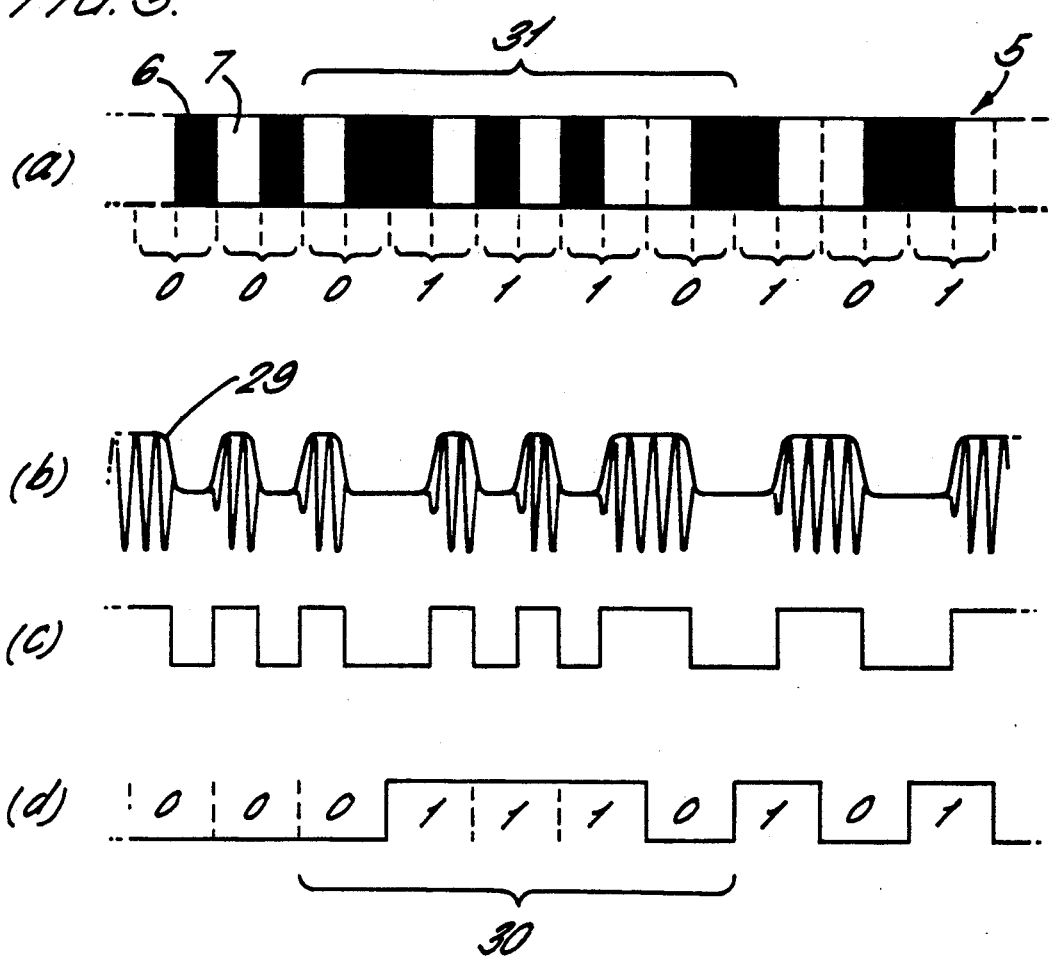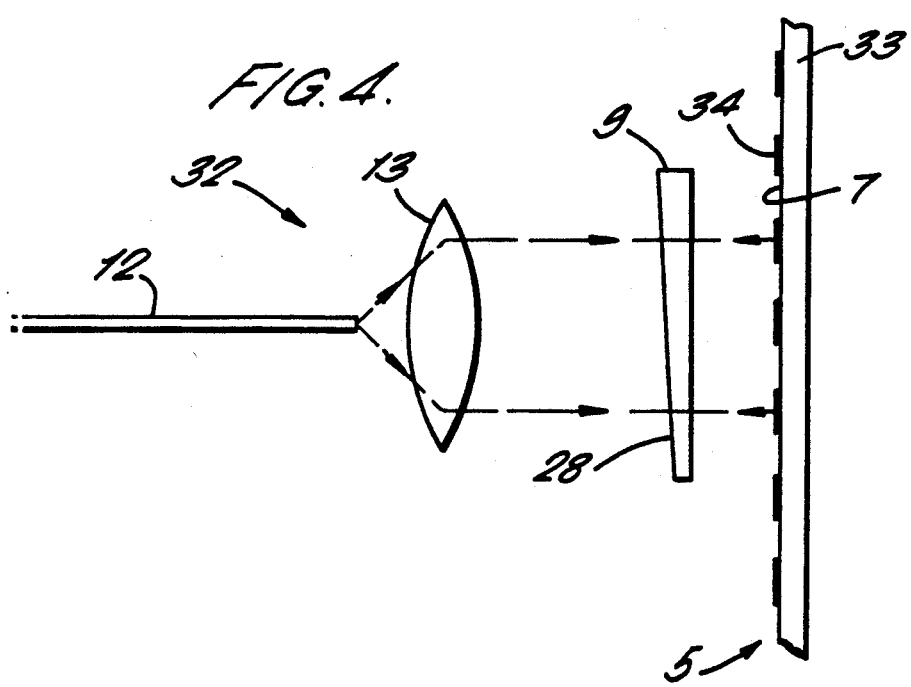

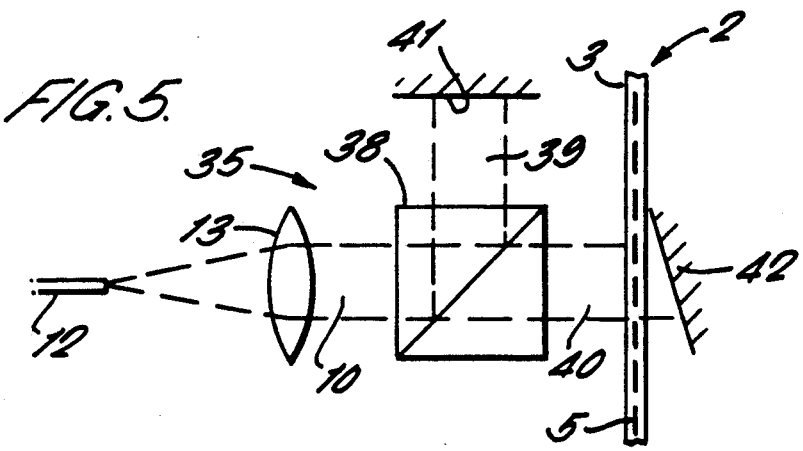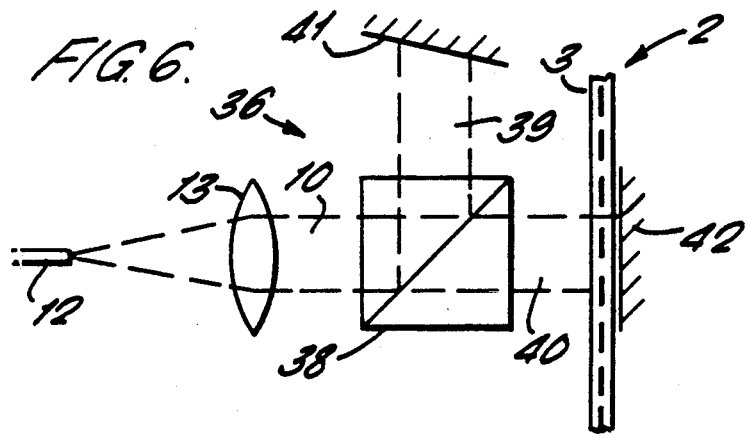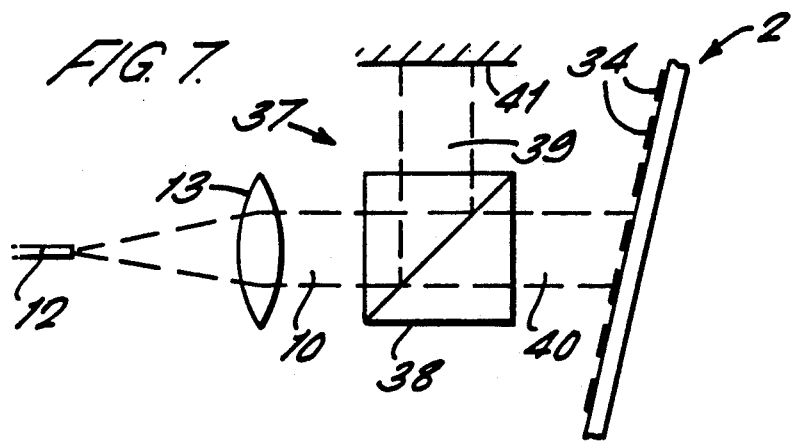

DISPLACEMENT MEASUREMENT APPARATUS WITH DUAL WEDGE INTERFEROMETERS

This invention relates to displacement measurement apparatus and in particular but not exclusively to apparatus including an optical displacement transducer for detecting a track encoded with a pseudo random binary sequence (PRBS).

Optical displacement transducers are known in which a coded track is moved relative to a transducer having means reading the coded track. The track and the transducer are attached to first and second bodies respectively so that the position of the transducer along the track is a measure of the displacement between the first and second bodies. The track can be encoded with binary words which can be read at any position along the track and which uniquely define the position along the length of the track, the track typically having code elements in the form of opaque or transparent bars extending across the width of the track. In the case of a PRBS encoded track a unique binary word is formed by a predetermined minimum number of adjacent code elements at any position along the length of the track. Examples of this arrangement are shown in GB-A-2126444.

It is generally required to transmit to a remote location the output of the reading means and it is generally desirable to use a fibre optic means conducting an output light beam encoded with the binary word from the reading means to the remote location. The output beam has hitherto been encoded by amplitude modulation of the beam with the coded track being sequentially scanned in order to produce a serially encoded signal.

A disadvantage of such an arrangement is that the reading means is complex and requires moving parts which may be susceptible to vibration effects and wear.

It is also known to transmit optically to a remote location the output of a transducer measuring small displacements using the properties of white light interferometry (Springer Proceedings in Physics 44, 227–233 (1989)). Displacement of one reflecting surface of a Fizeau interferometer results in a shift in the spectral modulation frequency in the output beam of the interferometer which is detected at the remote location. This technique is limited in use to the measurement of small displacements such as those found in pressure transducers.

According to the present invention there is disclosed displacement measurement apparatus comprising an optically detectable coded track and reading means to read from the track a coded word defining the position of the reading means along the track, the reading means comprising a broad spectrum light source directing a track illuminating beam of light onto a portion of the track such that a set of adjacent code elements defining the word are illuminated, each code element being optically distinguishable as being representative of one of first and second logical states, the apparatus further comprising light guide means conducting an output beam of light encoded with the word from the reading means to a remote location and decoding means at the remote location operable to reconstruct the word to enable the position of the reading means along the track to be remotely determined, wherein the reading means includes a first interferometer having beam splitting means operable to split light from the light source into a reference beam and the track illuminating beam, the respective beams being recombined in the interferometer to form the output beam after introducing an optical path difference between recombining components of the respective beams which varies according to the position along the portion of the track at which the component of the track illuminating beam is incident, the variation in path difference being progressive in the direction in which successive code elements appear on the track such that the illuminated code elements are associated with respective optical path length differences, the optical properties of the code elements being such that only those components of the illuminating beam associated with code elements representative of a first logical state contribute to interference effects in the output beam whereby the output beam is spectrally modulated only at spectral modulation frequencies associated with respective optical path length differences corresponding to the code elements representative of the first logical state, the decoding means being operable to detect spectral modulation- frequencies in the output beam to thereby reconstruct the word defining the position of the reading means along the track.

An advantage of such an arrangement is that it is not necessary to serially encode the binary word so that no moving parts are necessary at the reading means. A further advantage is that using relatively simple optical components the output beam is encoded with a frequency modulated signal which is inherently less susceptible to noise and loss effects when compared with amplitude modulation systems.

Preferably the code elements representative of the first and second logical state respectively comprise transparent and opaque portions of the track.

The code elements may alternatively comprise reflective and non-reflective portions of the track.

Conveniently the light source comprises a light emitting diode. Any broad spectrum source may be used however, the criterion for breadth of spectrum being that the coherence length of the emitted light should be shorter than the optical path length difference introduced by the interferometer. The term "light" here is used to indicate electromagnetic radiation in general and it should be understood that radiation having wavelengths outside of the visible region may alternatively be employed in the present invention.

Preferably the decoding means comprises a second interferometer located in the path of the output beam and operable to provide interference effects corresponding to substantially the same range of optical path difference between components of the output beam as provided in the first interferometer.

Preferably the second interferometer comprises a further beam splitter and means for recombining components of the beam after introducing an optical path difference between recombining components which varies spacially with respect to the beam.

The second interferometer may for example comprise an optical wedge or may comprise a conventional Michelson interferometer having fixed plane mirrors in which one mirror is tilted slightly from being orthogonal to the beam.

Preferably the decoding means includes a line scan sensor and means focussing the output of a second interferometer on to the line scan sensor.

The second interferometer may alternatively comprise means for recombining components of the beam after introducing a time scanned optical path between the recombining components.

The second interferometer may therefore comprise a scanning Michelson interferometer or may incorporate an electro-optical device of a type which provides a voltage dependent optical path length for light transmitted through the device.

Preferably the track is encoded with a PRBS.

Embodiments of the present invention will now be described by way of example only and with reference to the accompanying drawings, of which:

FIG. 1 is schematic diagram of displacement measurement apparatus in accordance with the present invention;

FIG. 2 is an enlarged view of the coded track and first interferometer of the apparatus of FIG. 1;

FIG. 3 is a graphical representation of (a) the coded track, (b) the output of the second interferometer, (c) the detected signal and (d) the decoded binary bits comprising the illuminated portion of coded track;

FIG. 4 is a schematic diagram of an alternative reading means having an optical wedge and reflective code elements for use in apparatus in accordance with the present invention;

FIG. 5 is a schematic diagram of a further alternative reading means having an inclined mirror;

FIG. 6 is a schematic diagram of a further alternative reading means in which the first interferometer includes an inclined mirror in the path of the reference beam;

FIG. 7 is a schematic diagram of a further alternative reading means in which the track is inclined relative to the track eliminating beam and the track includes reflective code elements;

Figure 8:
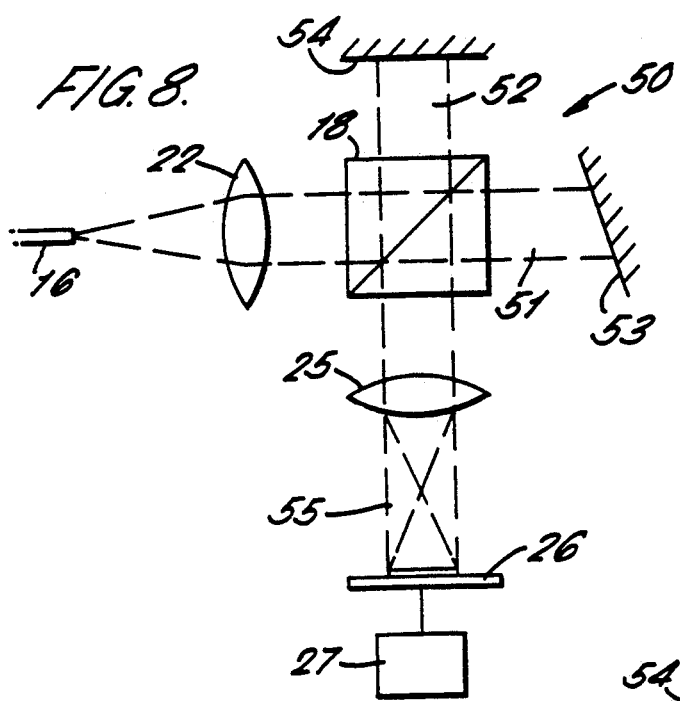
FIG. 8 is a schematic diagram of an alternative decoding means including an inclined mirror.

In FIG. 1 a displacement measurement apparatus 1 has a coded track 2 comprising an elongate transparent glass strip 3 which is longitudinally displaceable relative to a reading means 4.

The coded track 2 carries a sequence of code elements 5 as shown in FIG. 3(a) in which transparent bars 7 extending transversely of the track 2 comprise code elements representative of a first logical state 0 and opaque bars 6 comprise code elements representative of a second logical state 1.

The coded track 2 is encoded with a pseudo random binary sequence in Manchester code in which binary 0 is represented by two code elements having the sequence of logical states 0 1 and binary 1 being represented by code elements having the sequence of logical states 1 0. Each individual bit of the binary sequence is therefore represented by two adjacent code elements 5. In the example of FIG. 3 a binary sequence illustrated at (d) has a corresponding sequence of code elements shown at (a).

The reading means 4 includes a first interferometer 8 referred to below as the transmitting interferometer and comprising an optical wedge 9. The coded track 2 is illuminated by a light beam 10 which is provided by a light emitting diode 11 arranged to transmit light through an optical fibre 12 to the reading means 4. A collimating lens 13 forms light emerging from the optical fibre 12 into a collimated light beam 10 and the transmitting interferometer 8 is placed in the path of the light beam 10.

The coded track 2 is interposed between the collimating lens 13 and the transmitting interferometer 8 which is oriented such that the wedge 9 tapers in a direction parallel to the longitudinal extent of the coded track 2. The wedge 9 has a front face 28 and reflecting rear face 14 arranged to reflect light from the illuminating light beam 10 back through the collimating lens 13 and into the optical fibre 12. The optical fibre 12 ends in a first arm 15 connected to the light emitting diode 11 and is coupled to a second optical fibre comprising a second arm 16 extending to a remote location 17 at which is located a decoding means 18. The fibres comprising the first and second arms 15 and 16 are coupled in a conventional coupling device 35 and the free end of the second arm 16 is terminated in a matched termination 36.

The decoding means 18 comprises a second interferometer referred to below as the receiving interferometer and having an optical wedge 20 with a reflecting rear face 21. The wedge 20 is arranged to receive light emerging from the second arm 16 via a collimating lens 22 and a beam splitter 23. An output beam 24 emerges from the second arm 16 and is directed by the beam splitter 23 firstly to the wedge 20 and secondly into a further lens 25 arranged to focus the beam on to a detector 26. The detector 26 comprises a linear array of photo detectors with associated electronics arranged to produce a line scan of the image focussed on the detector.

The detector 26 is connected to an electronic processor 27 providing an output signal representative of the measured displacement of the coded track 2 relative to the reading means 4.

In the examples shown in FIGS. 1, 2 and 3 the coded track 2 is encoded with a 5-bit Manchester encoded PRBS shown at FIG. 3(d) in which a binary word 30 uniquely defining the track position is formed by a set 31 of ten of the adjacent code elements 5 shown in FIG. 3(a).

A 2.5 millimeter length of the track 2 is illuminated by the light beam 10 and light passes through the transparent bars 7 and is incident on the wedge 9. The wedge 9 is an air wedge which tapers between 25 and 45 micrometers over the illuminated length of 2.5 millimeters. The front face 28 acts as a beam splitter in that the light beam 10 is partially reflected back into the lens 13 and partly transmitted through the wedge 9. The light reflected from the rear face 14 of the wedge 9 returns through the transparent bars 7 together with the light reflected from the front face 28 and is collected by the collimating lens 13 so as to enter the optical fibre 12.

The path difference (i.e. the difference in optical path length) introduced by the wedge 9 between the light reflected from the front face 28 and rear face 14 will be different for each transparent bar 7 as shown in FIG. 2. The combined light beam entering the optical fibre 12 exhibits the characteristic effects associated with white light interferometry in which the spectrum of the light beam is modulated in frequency at a cyclical rate that is sensitive to the path difference. In other words the spectrum is modulated at a spectral modulation frequency associated with the path difference responsible for the interference. For each of the illuminated transparent bars 7 there will therefore be a different frequency of spectral modulation in the output light beam 24 which is transmitted to the receiving interferometer 19.

The receiving interferometer 19 is similarly an air wedge interferometer which results in correlation of further interference produced in the receiving interferometer with the interference produced in the transmitting interferometer wherever the path difference introduced by the respective interferometers is the same. The image produced on the detector 26 of the wedge 20 shows these regions of correlation as regions of alternating light and dark bars against a general background illumination. The image is represented in FIG. 3(b) in line scan form i.e. detected light intensity as a function of distance across the detector. The envelope 29 of the line scan in FIG. 3(b) effectively provides a fourier transform of the spectrum of light forming the output beam 24 so that each peak in the envelope represents a spectral modulation frequency in the output beam 24. For each of the illuminated transparent bars 7 there will therefore be a respective peak in the envelope 29.

The detector 26 and electronic processor 27 extract the envelope 29 from the received signal to obtain the detecting signal shown at FIG. 3(c) and this is readily converted to the binary code of FIG. 3(d). In this way the binary word 30 can be read at the remote location 17.

Digital processing of the binary signal to provide the required displacement measurement is then carried out in the normal way.

In the above example the binary signal contains more binary bits than the minimum number required to define the binary word 30 uniquely defining the position of the track relative to the reading means 4. The redundant information provided by these additional bits may be utilised for example in the event of obscuration of the code elements by dust or dirt by using suitable processing to avoid erroneous displacement measurements.

Further alternative reading means 32,35,36 and 37 are shown in FIGS. 4, 5, 6 and 7 respectively and are described below using corresponding reference numerals to those of preceding Figures for corresponding elements where appropriate.

The alternative reading means 32 of FIG. 4 includes an alternative coded track 33 in which code elements 5 comprise transparent bars 7 and reflective bars 34. An air wedge 9 is interposed between the track 33 and the collimating lens 13. Light collected by the collimating lens 13 consists of light reflected from the front face 28 of the wedge 9 and light which has been transmitted through the wedge and reflected from the reflective bars 34 so as to be returned through the wedge to the lens. Light incident on the transparent bars 7 is dissipated and does not contribute to the output beam. The reflective bars 34 thereby comprise code elements representative of a first logical state 0 and the transparent bars are code elements representative of a second logical state 1.

The alternative reading means 35 of FIG. 5 has a beam splitter 38 which splits the light beam 1? into a reference beam 39 and a track illuminating beam 40.

A plane mirror 41 is placed orthogonally in the path of the reference beam 39 which is therefore reflected back upon itself and passes through the beam splitter 38 into the lens 13.

The track illuminating beam 40 is directed onto code elements 5 formed on glass strip 3 of the coded track 2. A plane mirror 42 is placed in the path of light passing through the glass strip 3 at an angle which departs slightly from the orthogonal direction relative to the illuminating beam 40. The angle of inclination is exaggerated in FIG. 5 for clarity.

Light from the track illuminating beam 40 passing between opaque code elements 5 is reflected by mirror 42 so as to be returned to the beam splitter 38. Components of the reference beam 39 and track illuminating beam 40 recombine to form an output beam which is passed to the decoding means through the optical fibre 12. Recombining components of the respective beams produce interference effects associated with the optical path length difference introduced by the inclination of mirror 42 since different components of the track illuminating beam 40 travel a different distance before returning to the beam splitter 38 depending upon the position along the track at which the component of the beam is incident. The interference effects associated with light passing through successive transparent bars 7 is therefore characterised by the corresponding value of optical path difference.

In the further alternative apparatus 36 shown in FIG. 6 the reference beam 39 is directed onto an inclined mirror 41 whilst the track illuminating beam 40 is directed onto a mirror 42 which is placed orthogonally with respect to the track illuminating beam. The mirror 41 is in this case inclined in a direction such that an optical path difference is introduced between the combining components of the respective beams which varies according to the position along the track at which the component of the track illuminating beam is incident.

The alternative reading means 37 of FIG. 7 is similar to the reading means of FIG. 5 except that the track 2 is coded with reflective bars 34, the track 2 being inclined slightly from the orthogonal direction with respect to the track illuminating beam 40. The angle of inclination is exaggerated in the Figure for clarity.

In FIG. 8 an alternative decoding means 50 will now be described using corresponding reference numerals to those of FIG. 1 for corresponding elements where appropriate.

The decoding means 50 or receiving interferometer consists of a conventional Michelson interferometer in which incoming light from the second arm 16 is split by a beam splitter 18 into first and second beams 51 and 52 which are reflected back into the beam splitter by plane mirrors 53 and 54 respectively. One of the mirrors, in FIG. 8 shown as mirror 53, is tilted slightly from the orthogonal direction such that an interference fringe pattern is produced in the output beam 55 of the interferometer which is measured by the detector 26.

Mirror 53 is tilted to an extent which provides a range of optical path difference corresponding to that provided in the reading means so that the interference fringe pattern is modulated in the manner described with reference to FIG. 3(b).

Figure 9:
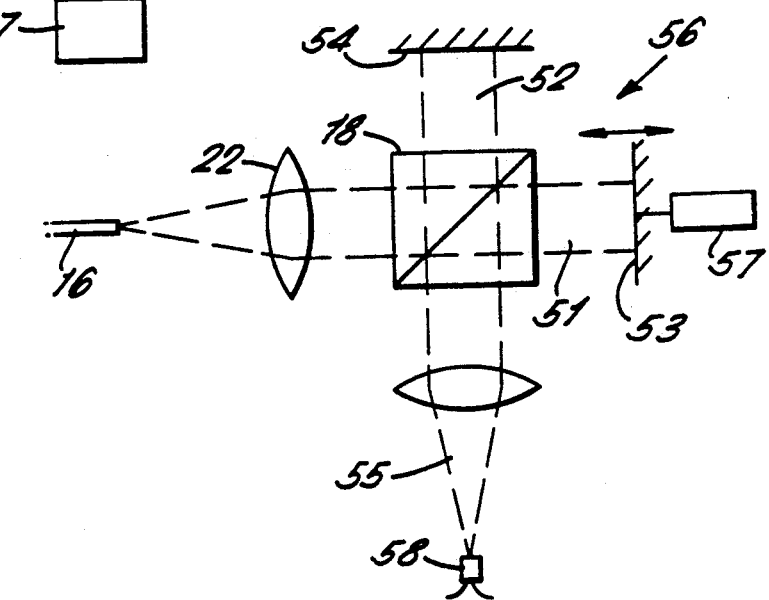
FIG. 9 is a schematic diagram of a further alternative decoding means having a scanning mirror.

A further alternative decoding means 56 is shown schematically in FIG. 9 where corresponding reference numerals to those of FIG. 8 are used where appropriate for corresponding elements.

The decoding means 56 or receiving interferometer of FIG. 9 is similarly a conventional Michelson interferometer but differs from decoding means 50 in that both mirrors 53 and 54 are maintained orthogonal to their respective beams 51 and 52. Mirror 53 is however scanned in the direction of the first beam 51 by means of a piezoelectric actuator 57 in a predetermined cyclical manner. The output beam 55 is focused onto a single photodetector 58 which during a single scan of mirror 53 detects a time varying signal corresponding to the waveform shown in FIG. 3(b) provided that the piezoelectric actuator 57 provides a linear scanning movement of the mirror.

Figure 10:
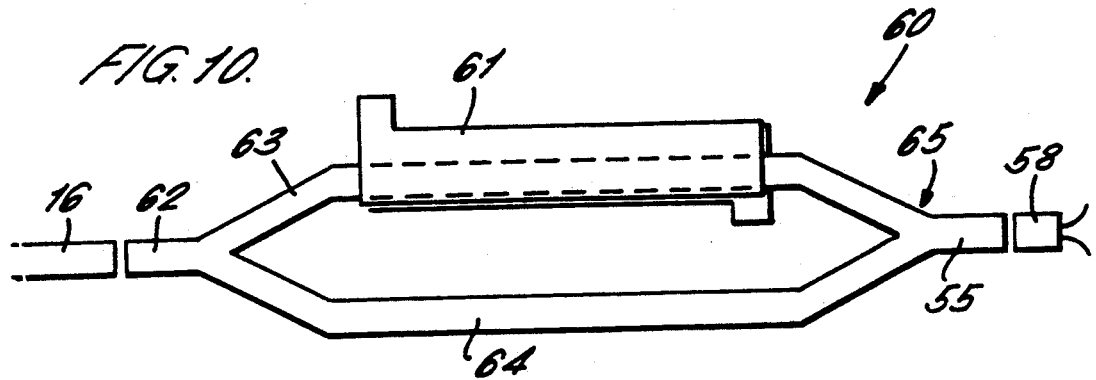
FIG. 10 is a schematic diagram of a further alternative decoding means including an electro-optical device.

A further alternative decoding means 60 as shown schematically in FIG. 10 also provides a time varying signal representative of the interference pattern of FIG. 3(b) using a single photodetector 58. Interference effects are however produced by means of an electro-optical device 61 of a type which provides a voltage dependent optical path length for light transmitted through the device. The second fibre optic arm 16 is connected to a bifurcated optical waveguide 62 having a first arm 63 which includes the electro-optical device 61 and a second arm 64. The first and second arms 63 and 64 are recombined in a coupling 65 to provide an output beam 55 which is detected in a single photodetector 58.

A ramped scanning voltage is applied to the device 61 in order to introduce an optical path length difference corresponding to the range of optical path length difference provided by the reading means so that a time varying interference waveform corresponding to that of FIG. 3(b) is produced.

The coded track may alternatively comprise a metal strip having code elements formed by etching apertures in the metal strip such that the apertures comprise transparent bars separated by opaque bars formed by un-etched portions of the metal strip.

The optical wedges may be formed of solid glass or may be formed as an air or vacuum wedge in known manner.

I claim:

1. Displacement measurement apparatus comprising an optically detectable coded track and reading means to read from the track a coded word defining the position of the reading means along the track, the reading means comprising a broad spectrum light source directing a track illuminating beam of light onto a portion of the track such that a set of adjacent code elements defining the word are illuminated, each code element being optically distinguishable as being representative of one of first and second logical states, the apparatus further comprising light guide means conducting an output beam of light encoded with the word from the reading means to a remote location and decoding means at the remote location operable to reconstruct the word to enable the position of the reading means along the track to be remotely determined, wherein the reading means includes a first interferometer having beam splitting means operable to split light from the light source into a reference beam and the track illuminating beam, the respective beams being recombined in the interferometer to form the output beam after introducing an optical path difference between recombining components of the respective beams which varies according to the position along the portion of the track at which the component of the track illuminating beam is incident, the variation in path difference being progressive in the direction in which successive code elements appear on the track such that the illuminated code elements are associated with respective optical path length differences, the optical properties of the code elements being such that only those components of the illuminating beam associated with code elements representative of a first logical state contribute to interference effects in the output beam whereby the output beam is spectrally modulated only at spectral modulation frequencies associated with respective optical path length differences corresponding to the code elements representative of the first logical state, and the decoding means being operable to detect spectral modulation frequencies in the output beam to thereby reconstruct the word defining the position of the reading means along the track.

2. Displacement measurement apparatus as claimed in claim 1 wherein the first interferometer comprises an optical wedge tapering in the direction in which successive code elements appear on the track such that the illuminated code elements are associated with respective thicknesses of the wedge.

3. Displacement measurement apparatus as claimed in claim 1 wherein the code elements representative of the first and second logical state respectively comprise transparent and opaque portions of the track.

4. Displacement measurement apparatus as claimed in claim 1 wherein the code elements representative of the first and second logical state respectively comprise reflective and non-reflective portions of the track.

5. Displacement measurement apparatus as claimed in claim 1 wherein the light source comprises a light emitting diode.

6. Displacement measurement apparatus as claimed in claim 1 wherein the decoding means comprises a second interferometer located in the path of the output beam and operable to provide interference effects corresponding to substantially the same range of optical path difference between components of the output beam as provided in the first interferometer.

7. Displacement measurement apparatus as claimed in claim 6 wherein the second interferometer comprises a further beam splitter and means for recombining components of the beam after introducing an optical path difference between recombining components which varies spatially with respect to the beam.

8. Displacement measurement apparatus as claimed in claim 7 wherein the second interferometer comprises an optical wedge.

9. Displacement measurement apparatus as claimed in claim 7 wherein the decoding means includes a line scan sensor and means focussing the output of the second interferometer on to the line scan sensor.

10. Displacement measurement apparatus as claimed in claim 6 wherein the second interferometer comprises a further beam splitter and means for recombining components of the beam after introducing a time scanned optical path difference between the recombining components.

11. Displacement measurement apparatus as claimed in claim 1 wherein the track is encoded with a PRBS (pseudo random binary sequence).

12. Displacement measurement apparatus comprising an optically detectable coded track and reading means to read from the track a coded word uniquely defining the position of the reading means along the track, the reading means comprising a broad spectrum light source directing an illuminating beam of light onto a portion of the track such that a set of adjacent code elements defining the word are illuminated, each code element being optically distinguishable as being representative of one of first and second logical state, the apparatus further comprising light guide means conducting an output beam of light encoded with the word from the reading means to a remote location and decoding means at the remote location operable to reconstruct the word to enable the position of the reading means along the track to be remotely determined, wherein the reading means includes a first wedge interferometer in the path of the illuminating beam and having an optical wedge tapering in the direction in which successive code elements appear on the track such that the illuminated code elements are associated with respective thicknesses of the wedge, the optical properties of the code elements being such that only those portions of the wedge associated with code elements representative of a first logical state contribute to interference effects in the output beam whereby the output beam is spectrally modulated only at spectral modulation frequencies associated with respective wedge thicknesses corresponding to the code elements representative of the first logical state, the decoding means being operable to detect spectral modulation frequencies in the output beam to thereby reconstruct the word defining the position of the reading means along the track.

13. A method of displacement measurement by reading from an optically detectable coded track a coded word defining the position of a reading means along the track, the reading means comprising a broad spectrum light source directing a track illuminating beam of light onto a portion of the track such that a set of adjacent code elements defining the word are illuminated, each code element being optically distinguishable as being representative of one of first and second logical states, conducting by light guide means an output beam of light encoded with the word from the reading means to a remote location and operating a decoding means at the remote location to reconstruct the word to enable the position of the reading means along the track to be remotely determined, wherein the reading means includes a first interferometer having beam splitting means splitting light from the light source into a reference beam and the track illuminating beam, the respective beams being recombined in the interferometer to form the output beam after introducing an optical path difference between recombining components of the respective beams which varies according to the position along the portion of the track at which the component of the track illuminating beam is incident, the variation in path difference being progressive in the direction in which successive code elements appear on the track such that the illuminated code elements are associated with respective optical path length differences, the optical properties of the code elements being such that only those components of the illuminating beam associated with code elements representative of a first logical state contribute to interference effects in the output beam whereby the output beam is spectrally modulated only at spectral modulation frequencies associated with respective optical path length differences corresponding to the code elements representative of the first logical state, and the decoding means being operated to detect spectral modulation frequencies in the output beam to thereby reconstruct the word defining the position of the reading means along the track.

* * * * *